United States Patent [19]

DeFevere et al.

[11] 4,026,240

[45] May 31, 1977

[54] LIQUID PHASE EPITAXIAL REACTOR APPARATUS

[75] Inventors: Dennis C. DeFevere, Palo Alto; Raymond Solomon, Sunnyvale, both of Calif.

[73] Assignee: Hewlett-Packard Company, Palo Alto, Calif.

[22] Filed: Nov. 17, 1975

[21] Appl. No.: 632,541

[52] U.S. Cl. .......................... 118/415; 23/273 SP; 118/423; 156/422; 148/172
[51] Int. Cl.² ..................... B01D 9/00; B05C 3/02; B05C 3/18; H01L 40/00
[58] Field of Search ............... 23/273 SP; 156/622; 148/171, 172; 118/415, 413, 423

[56] References Cited

UNITED STATES PATENTS

| | | | |
|---|---|---|---|
| 3,809,584 | 5/1974 | Akai et al. | 156/622 X |
| 3,854,447 | 12/1974 | Kobayashi | 156/622 X |
| 3,899,371 | 8/1975 | Ladany et al. | 148/171 |
| 3,940,296 | 2/1976 | Van Oirschot et al. | 118/415 |

*Primary Examiner*—Morris O. Wolk
*Assistant Examiner*—Michael S. Marcus
*Attorney, Agent, or Firm*—Ronald E. Grubman

[57] ABSTRACT

A liquid phase epitaxial reactor is provided in which a simple cycling mechanism sequentially feeds semiconductor wafers from an input stack into a deposition region and thence to an output stack. In preferred embodiments, a cam is employed to tilt the output stack to accommodate the positioning of each successive wafer in the stack.

5 Claims, 5 Drawing Figures

LIQUID PHASE EPITAXIAL REACTOR APPARATUS

BACKGROUND OF THE INVENTION

This invention relates generally to the manufacture of semiconductor devices, and more particularly to apparatus for use in Liquid Phase Epitaxial (LPE) deposition processes.

In the mass production of semiconductor devices, it is often required that large numbers of semiconductor wafers be subjected to LPE deposition. In the prior art, it was typical that many wafers were exposed to a liquid melt containing the source to be deposited at the same time. It was therefore necessary to utilize a very large melt area, or alternately, to divide the melt into a number of portions equal to the number of wafers on which deposition was to occur. This latter scheme is often referred to as the Aliquot technique. Both of these prior art deposition methods required a fixture of physical size much greater than is required for deposition upon a single wafer. To dissolve the source material in the melt, the fixture had to be placed in a relatively large heating furnace. However, it is very difficult to achieve a uniform temperature profile over a very large fixture. Furthermore, during the LPE deposition process, the temperature in the furnace must be rapidly decreased, which is more difficult to achieve in a large furnace than in a smaller one.

It is therefore an object of the present invention to provide a serially operative liquid phase epitaxial reactor in which wafers may be stacked before and after epitaxial growth to minimize the required reactor and furnace size.

It is a further object of the invention to provide a liquid phase epitaxial reactor in which a simple cycling mechanism induces feeding of the wafers into the melt region and extraction of the wafers from the melt region.

SUMMARY OF THE INVENTION

In accordance with the illustrated preferred embodiment the present invention provides a liquid phase epitaxial reactor apparatus in which semiconductor wafers are held in recessed trays which are themselves placed vertically one on another to form an input stack. An actuator rod is used to sequentially push wafers from the bottom of the input stack into position under one or more liquid melt regions. After deposition, each wafer is displaced into a position at the bottom of an output stack. In preferred embodiments a cam at the end of the actuator rod induces tilting of the output stack so that as successive wafers are grown upon they may be displaced into position below the stack.

DESCRIPTION OF THE PREFERRED EMBODIMENTS

Figure 1:
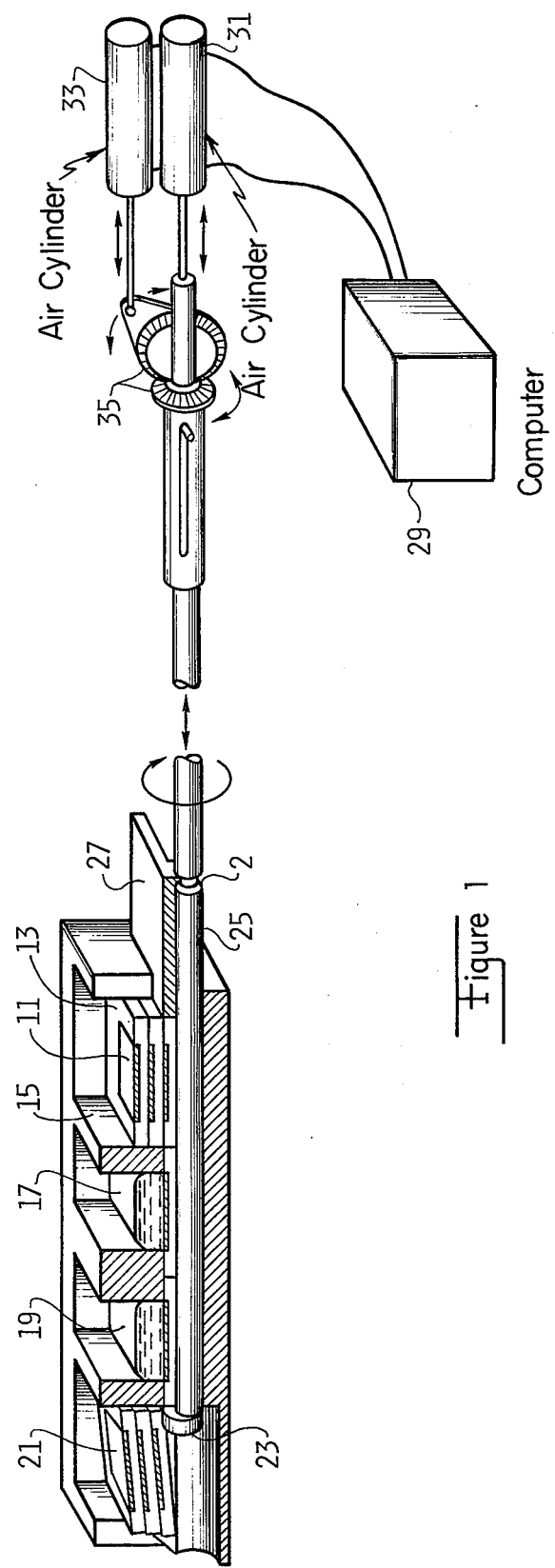
FIG. 1 illustrates an LPE Reactor in accordance with a preferred embodiment of the invention.

In FIG. 1 there is illustrated a wafer 11 of a semiconductor material. On the surface of wafer 11 there is to be deposited another semiconductor material by a growth process commonly known as liquid phase epitaxial deposition (LPE). LPE deposition is a well known process in the manufacture of semiconductor devices and will be discussed herein only in sufficient detail that the features of the present invention may be readily understood. In accordance with aspects of the present invention, wafer 11 is situated in a recessed area of a tray 13. A number of trays are thereby enabled to be stacked one upon another without unwanted contact to the surface area of the various wafers. In FIG. 1 three trays, each holdig a wafer, are illustrated as being stacked one on another to form an input stack labeled 15.

A liquid melt 17 is placed in a cavity of the reactor adjacent to input stack 15. Liquid melt 17 includes source materials to be deposited on the wafer, e.g., GaAs, AlGaAs, and GaP. If it is desired to provide for the epitaxial deposition of a second layer upon the first layer, a second liquid melt 19 may be placed in another cavity of the reactor.

Another stack of trays (shown, for purposes of illustration, as including three trays) is labeled 21 and serves as an output stack to collect wafers which have been processed. The trays comprising output stack 21 are shown as being slightly tipped by virtue of the action of a cam 23 mounted on the end of a shaft 25. According to aspects of the invention, shaft 25 may be rotated about its central axis and also laterally translated along its length. A "push-in" plate 27 is engaged in a slot 29 in shaft 25 and also contacts the bottom tray of input stack 15. Translational motion of shaft 25 to the left or right will thereby induce a corresponding translational motion of push-in plate 27.

The cycling of wafers through the furnace may also be automated, e.g., by the use of an electronic computer 29. Computer 29 may be simply programmed to cause rotation and/or translation of shaft 25. For example, the computer may electronically activate cylinder 31 which imparts translation to shaft 25. Another air cylinder 33 may be actuated to impart rotation to shaft 25 through bevel gears 35 in a conventional manner. Other electro-mechanical devices for implementing the above-described automation will be apparent to those skilled in the art.

Operation of an epitaxial reactor according to the invention may be better understood by reference now to FIGS. 2a–2d. Initially, a number of trays, each containing a wafer, are placed in the reactor to form the input stack 15. The reactor is placed in a furnace (not shown) which is raised to an operating temperature sufficiently high to dissolve the source material into the melt. Typical temperatures for the materials mentioned above are in the range 600° to 1100° C. After the source material has dissolved in the melt, the temperature of the furnace is decreased at a controlled rate. Deposition of the source material onto the wafers takes place during this period of decreasing temperature. The configuration of FIG. 2a assumes that several cycles of operation have already been completed. The output stack 21 therefore includes a number of trays containing wafers upon which epitaxial deposition has already been performed.

A tray 37 is shown in position under melt 19, the associated wafer having already received two epitaxial depositions. Another tray 39 is shown under melt 17, the wafer in this tray having received a first epitaxial deposition. Yet another tray 41 at the bottom of input stack 15 is next in sequence for deposition when a new cycle begins.

Figure 2A:
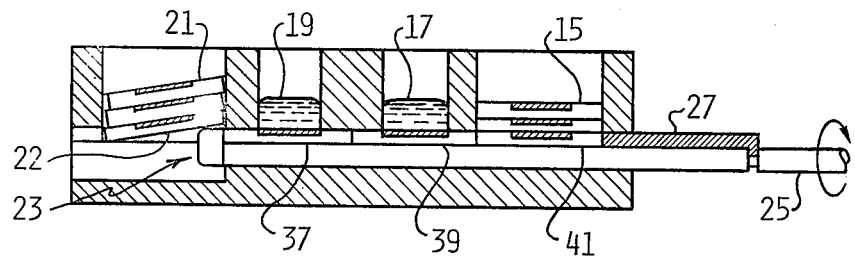
FIGS. 2a–2d illustrate the operation of the LPE reactor of FIG. 1.
Figure 2B:
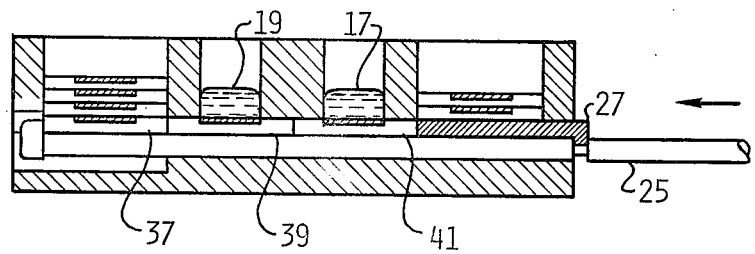

To initiate a cycle of deposition, shaft 25 is rotated so that a high portion of cam 23 comes into contact with the bottom tray 22 of output stack 21, thereby lifing up one edge of output stack 21. In FIG. 2b rod 25 is pushed to the left thereby forcing push-in plate 27 to displace tray 41 into position beneath melt 17 preparatory to a first deposition. This action also drives tray 39 into position beneath melt 19 for a second deposition, while tray 37 will be pushed under output column 21. The device is left in this configuration for a sufficient time that the wafer contained in tray 41 receives an epitaxial layer of desired thickness deposited from melt 17. At the same time the wafer contained in tray 39, having received a first epitaxial layer in the previous cycle, now receives a second layer epitaxially deposited from melt 19. Growth of each layer is terminated by reactuating the mechanism to displace the trays to the left.

Figure 2C:
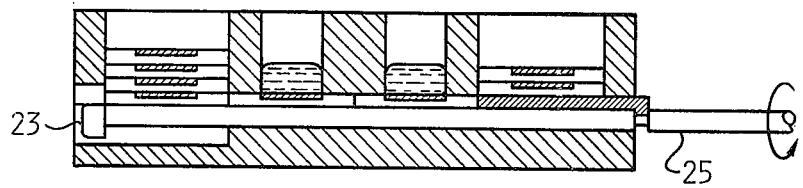
Figure 2D:
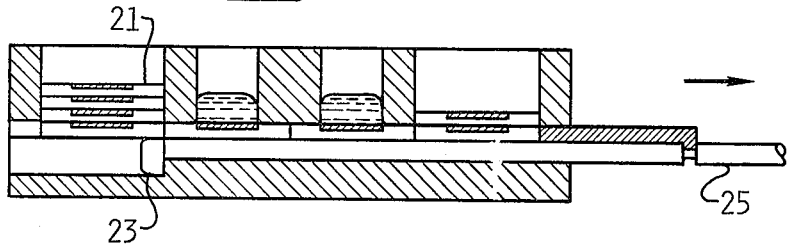
Figure 1:
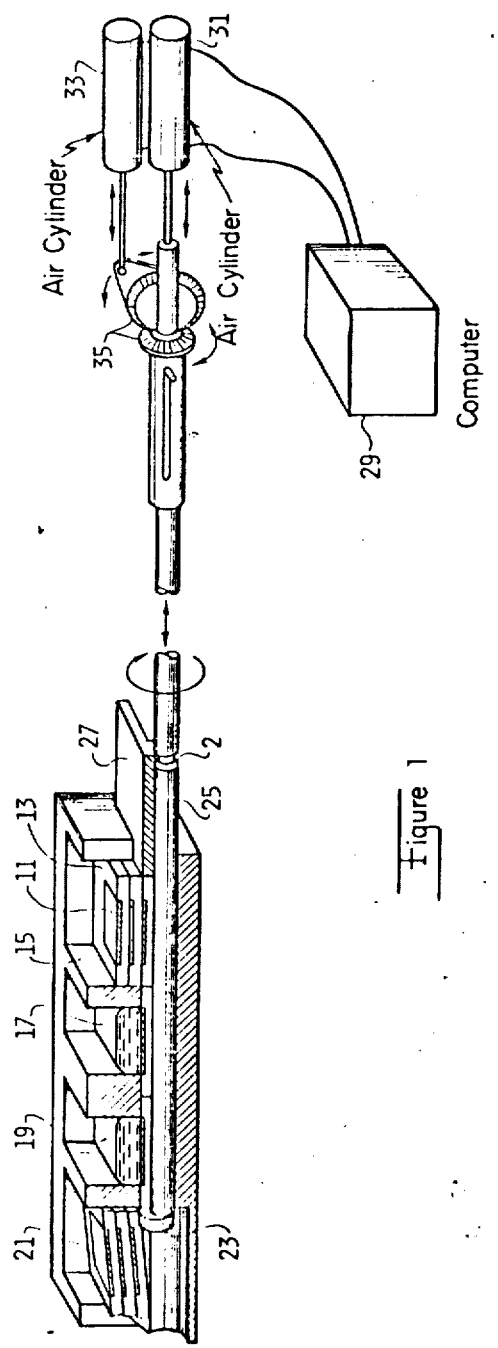

In FIG. 2c rod 25 is rotated counterclockwise to position the high side of cam 23 downward preparatory to withdrawal of the rod. In FIG. 2d rod 25 is withdrawn to the right thereby repositioning cam 23 beneath the right side of output column 21. The reactor is now configured for the commencement of a new deposition cycle. Operation may be continued until each wafer in the input column has been grown on.

As described above the wafers are grown during periods of cooling of the reactor. Thus, when the furnace has cooled to a degree such that the source material is insoluable in the melt, the reactor must be reheated before further deposition may take place. It has been found that where deposition of a few microns of epi are required about 12 wafers may be grown during each period of temperature cooling.

We claim:

1. Apparatus for epitaxially depositing source materials on semiconductor wafer, comprising:
   a housing including a plurality of cavities therein;
   a melt in one of said cavities, said melt containing a source material to be deposited;
   an input stack of semiconductor wafers awaiting epitaxial deposition, said input stack being positioned in a second one of said cavities;
   an output stack of semiconductor wafers having received epitaxial deposition, said output stack being positioned in a third one of said cavities;
   a shaft mounted in said housing for translation and rotation, translation of said shaft acting to drive wafers from a position in said input stack to a position in contact with said melt, and to drive wafers away from said melt into a position in said output stack; and
   a cam interconnected with said shaft for rotation in response to rotation of said shaft to tilt said output stack preparatory to a wafer being positioned therein.

2. Apparatus as in claim 1 further comprising:
   a second melt in another of said cavities, said second melt containing a second source material to be deposited;
   said shaft being adapted for positioning each wafer in contact with said second melt while a subsequent wafer is positioned in contact with said melt, whereby each wafer may receive an expitaxially depoisted layer of said second source material.

3. Apparatus as in claim 1 further comprising:
   electro-mechaical means for automatically driving each of said wafers from a position in said input stack to a position in contact with said melt and driving each wafer away from said melt into a position in said output stack when a desired thickness of source material has been deposited on the wafer.

4. Apparatus as in claim 3 wherein said electromechanical means comprises:
   an electronic computer;
   a first actuating device responsive to electrical signals from said computer for imparting translational motion to said shaft; and
   a second actuating device responsive to electrical signals from said computer from imparting rotational motion to said shaft.

5. Apparatus as in claim 4 wherein each of said first and second actuating devices comprises an air cylinder mechanism.

* * * * *

UNITED STATES PATENT AND TRADEMARK OFFICE
CERTIFICATE OF CORRECTION

Page 1 of 2

PATENT NO. : 4,026,240
DATED : May 31, 1977
INVENTOR(S) : Dennis C. DeFevere and Raymond Solomon It is certified that error appears in the above—identified patent and that said Letters Patent are hereby corrected as shown below:

The drawing appearing below columns 1 and 2 of the title page should be cancelled and the drawing on the attached sheet substituted therefor.

Signed and Sealed this

Twenty-eighth Day of February 197

[SEAL]

Attest:

RUTH C. MASON
Attesting Officer

LUTRELLE F. PARKER
Acting Commissioner of Patents and Trademar